United States Patent [19]

Chan et al.

[11] Patent Number: 4,689,111

[45] Date of Patent: Aug. 25, 1987

[54] PROCESS FOR PROMOTING THE INTERLAMINATE ADHESION OF POLYMERIC MATERIALS TO METAL SURFACES

[75] Inventors: Kevin K. Chan, Staten Island; Vicki J. Malueg, Apalachin, both of N.Y.

[73] Assignee: International Business Machines Corp., Armonk, N.Y.

[21] Appl. No.: 923,977

[22] Filed: Oct. 28, 1986

[51] Int. Cl.[4] .......................... C23F 1/00; B44C 1/22; C03C 15/00; C03C 25/06
[52] U.S. Cl. .................................... 156/643; 156/629; 156/646; 156/651; 156/666; 156/902; 252/79.1
[58] Field of Search ............... 156/629, 630, 634, 643, 156/646, 656, 666, 901, 902, 651; 252/79.1; 51/281 R, 317, 319, 321

[56] References Cited

U.S. PATENT DOCUMENTS

| | | | |
|---|---|---|---|
| 3,455,775 | 7/1969 | Pohl et al. | 156/629 X |
| 4,416,725 | 11/1983 | Cuomo et al. | 156/666 X |
| 4,557,796 | 12/1985 | Druchke et al. | 156/643 |

OTHER PUBLICATIONS

IBM Technical Disclosure Bulletin, vol. 26, #7A, "Enhanced Adhesion to Interlevel Polyimide", Cote, W. and Holland, S.

IBMTDB, vol. 26, #10B, "Improved Hydrophilic Property by Water Plasma", Lo, J. and Lu, J.

IBMTDB, vol. 27, No. 6; "Plasma Polymer Surface Adhesion Modification Method", Nguyen, S. and Underhill, J.

IBMTDB, vol. 26, No. 5; "Plasma Treatment to Improve Photoresist Adhesion to Various Substrates"; Auda, B.

IBMTDB, vol. 26, No. 3B; "Surface Treatment of Polyimide to Facilitate Adhesion of Metallic Surface Layers"; Collins, G. and Morgan, W.

IBMTDB, vol. 25, No. 12; "Improved Adhesion Between Metal and Polymer Surfaces"; Cuomo, J., Guarnieri, C. and Yee, D.

IBMTDB, vol. 22, No. 1; "Method for Improving Adhesion of Polyimides", Abrahmovich, K., Gleason, R. and Motsiff, W.

Primary Examiner—William A. Powell
Attorney, Agent, or Firm—Perman & Green

[57] ABSTRACT

A method for improving the adhesion of a polymer such as an epoxy resin to a metal such as copper wherein the metal surface to be adhered is sequentially exposed to a pressurized stream of a slurry containing suspended metal oxide particles followed by treating the metal oxide treated film in a gas plasma containing a fluorohydrocarbon.

12 Claims, No Drawings

PROCESS FOR PROMOTING THE INTERLAMINATE ADHESION OF POLYMERIC MATERIALS TO METAL SURFACES

BACKGROUND OF THE INVENTION

1. Field of the Invention

This invention relates to a method of improving the adhesion of a polymeric material to a metal surface and more particularly to the adhesion of epoxy resins to metallic substrates such as are used in the manufacture of electronic printed circuit boards.

2. The Prior Art

In many applications, it is essential to provide strong adherence between a metallic surface and a polymeric surface. Examples of such uses are widely diversified. For example, the strong adherence of metal to polymer is critical in the manufacture of multilayer printed circuit boards in the electronics, telecommunications, computer and other industries.

In the manufacture of electronic devices, such as computers, printed circuit boards are widely used to support discrete electronic components and to provide the electrical circuitry between the components. The printed circuit boards are composite structures having a central core, typically a dielectric material such as glass fiber and a thermosetting resin such as an epoxy, phenolic polyester or other thermosetting resin, referred to in the art as a "prepreg". The prepreg has applied on either side thereof, metallized circuitry, usually formed of a metal film layer such as copper. The metal film layer is etched or otherwise processed to provide circuits of predetermined geometrical configuration. The printed circuit board may be two-sided composite board having circuitry on the top and bottom sides of the dielectric layer, or it may be laminated multilayer board which also contains internal signal lines and power planes separated by the dielectric polymeric material. The laminated multilayer printed circuit boards are prepared from individual composite circuit boards which are laminated to form the multilayer structure having the etched metal circuitry sandwiched between the prepreg layers. The laminated multilayer boards are provided with via holes and interstitial via holes to interconnect the various circuit lines and power planes.

Various methods have been employed for providing a metal film layer on one side of a prepreg substrates which is to be laminated to form a multilayer printed circuit board. Such methods include deposition by vacuum metallization and electroless plating. While electroless plating has become a desirable and cost efficient method of depositing metal film layers such as copper onto polymeric prepreg substrates, the adhesion of such layer after deposition to other polymeric substrates is often less than adequate, especially with respect to polymers such as epoxy resins. Copper, when electroless plated, is in its pure form and like other pure metals, generally exhibits poor adhesion characteristics for bonding to polymeric substrates. For example, it has been determined that in order for a multilayer printed circuit board having copper signal lines sandwiched between dielectric layers formed from epoxy resins to meet commercial specifications, it is required that the interlaminate bond strength between the copper film layer and the opposed dielectric layer be at least about 4.2 pounds pull per inch (lbs/in.). If an attempt to laminate an untreated copper coated epoxy substrate to an epoxy based substrate were made, the interlaminate bond strength would generally be found to be in the range of about 1-2 lbs/in.

To improve the interlaminate bond strength of electroless plated copper films to epoxy resin based dielectrics, it has been the practice in the art to treat the copper film surface prior to lamination with a solution of sodium chlorite and sodium hydroxide at temperatures near boiling to convert the copper film surface to a more adherent copper oxide. Such a solution generally contains 3 to 8% by weight chlorite. This chlorite treatment step generally raises the interlaminate bond strength of the copper film layer to about 5.0–10.0 lbs/in.

A drawback to the chlorite adhesion promoting treatment, which has been used since the early days of printed circuit technology is that the oxide coatings formed are often non-uniform, resulting in areas of poor copper to polymer adhesion after lamination. Particular care must be paid to the thickness of the oxide coating, i.e. it must be very uniform or else poor adhesion will result.

Another drawback to the chlorite treatment step is that the copper metal surface must be cleaned with surfactants and highly corrosive mineral acids prior to immersion in the chlorite solution. The present process does not require such a cleaning pre-step.

A further drawback to the chlorite treatment is that the concentrated solutions used to effect a chemical conversion of copper to copper oxide to promote adhesion also tend to undercut the deposited copper film layer, i.e., laterally undermine the conductor paths on the circuit patterns etched in the prepreg surface.

Another main disadvantage to the use of chlorite solutions for the enhancement of polymer adhesion during lamination to metallized surfaces is that the spent chlorite solutions are hazardous chemicals and create disposal problems which arise from the fact that generally the spent solution cannot be simply discarded without appropriate treatment to avoid pollution, thereby increasing the expense of using the treatment.

OBJECTS AND SUMMARY OF THE INVENTION

Accordingly, it is a principal object of this invention to provide an improved process for enhancing the adhesion of polymeric layers laminated to metallic surfaces to prepare multilayer articles particularly adapted for the manufacture of printed circuit boards.

Another object is to provide an improved process for promoting the adhesion of copper circuit lines in the internal layers of a multilayer printed circuit board to opposed dielectric substrates.

A still further object is to provide an improved process for promoting adhesion between interplane copper circuit lines and printed circuit board dielectric epoxy surfaces without the use of corrosive chemicals.

The foregoing and other objects and advantages are accomplished in accordance with the process of the present invention wherein the adhesion of metal films such as copper to polymeric epoxy substrates is improved by sequentially impinging the surface of the metal film with a pressurized steam of a slurry in which is suspended metal oxide particles, preferably aluminum oxide particles, and then etching the metal oxide treated metal surface in a plasma environment containing a fluorohydrocarbon.

As will hereinafter be further demonstrated by using a combination of metal oxide and fluorohydrocarbon plasma treatment steps, the interlaminate bond strength values of a metal film layer such as electrolessly deposited copper, to an opposed polymeric surface, such as an epoxy polymer, are found to be in excess of 5.0 lbs/in., thereby eliminating the need for the use of corrosive chemical reagents to effect the promotion of interlaminate adhesion.

DESCRIPTION OF THE PREFERRED EMBODIMENTS

The foregoing and other objects and advantages of the present invention will become more readily apparent from the detailed description of the preferred embodiments.

The metal surface treated according to the present invention may be any metal to which a polymer need be adhered. In the electronics industry this generally will be copper, aluminum or silver. Copper films deposited on epoxy dielectric surfaces which can be laminated to opposed epoxy based prepregs to prepare printed circuit boards are generally prepared by electrolessly metallizing techniques wherein the surface of the polymeric epoxy substrate is first conditioned or activated to receive a copper deposit by seeding the surface with a colloidal palladium-tin catalyst and then electrolessly plating a copper film on the activated surface using a plating bath containing a cupric salt such as copper sulfate, a reducing agent for the salt such as formaldehyde, a complexing agent such as EDTA and a pH adjuster such as sodium hydroxide. These metal films are typically deposited at a thickness of about 0.001-0.002 inches or about 250-500 microns.

The deposited metal film layer and particularly a copper film layer is treated in accordance with the present invention by impinging onto the film a pressurized stream of a slurry or suspension of metal oxide particles whereby the surface is roughened thereby increasing the surface area available for bonding. Suitable metal oxide particles useable herein include oxides of aluminum, silicon, titanium, and the like either individually or in combination with each other or with other metals. Preferably aluminum oxide particles are used due to their high abrasive quality. The metal oxide slurry generally contains about 10 to about 30 percent of weight and preferably about 15 to about 25 percent by weight of metal oxide solids suspended in a suitable liquid suspending medium. The suspending media is usually water though it may contain biocides, thixotropes, surfactants, and the like provided they do not effect the abrasive qualities of the metal oxide particles. The particle size of the metal oxide particles suspended in the slurry generally will be less than about 100 microns. For aluminum oxide particles, the preferred size is from about 17 microns to about 70 microns with an average particle size of about 35 microns. The slurry is prepared by adding the metal oxide particles to the suspending medium and agitating the dispersed particles using conventional methods such as mechanical rotors or air agitation for a time sufficient to prepare a uniform suspension of the particles. The metal oxide slurry is impinged on the metal film surface by spraying or "vapor" blasting the metal surface with the slurry being emitted from a suitable jet device at a pressure of greater than about 30 pounds per square inch (psi) and preferably about 40 to about 80 psi. For aluminum oxide particles the most preferred pressure is about 45 to 65 psi. The vapor blasting should continue for a sufficient time to roughen the surface and this will generally be about 0.5 to 5 minutes or more depending upon the abrasiveness of the particular metal oxide particles utilized. For aluminum oxide particles, the time is generally from about 0.5 to 3 minutes, preferably about 1 to 2 minutes. Preferably the vapor blasting is performed by placing the metal surface on a conveyor table and moving the metal under the spray of the metal oxide slurry.

After the metal surface has been subjected to the pressurized metal oxide slurry treatment, the treated metal layer is rinsed with water to remove any surface contamination caused by traces of metal oxide that may remain on the metal surface. Thereafter the rinsed metal layer is dried with pressurized air at ambient temperature. After being subjected to the pressurized stream of metal oxide oxide slurry and dried, the metal film layer is exposed to a gaseous fluorohydrocarbon to further clean the surface and effect fluorination thereof.

In the fluorohydrocarbon plasma exposure step of the present invention, the metal oxide treated metal surface to be plasma treated is exposed to a plasma generated in a reactor of the type used for plasma etching. The practice of plasma etching is well established in the art e.g. U.S. Pat. Nos. 3,795,557, 4,157,251, 4,180,432, 4,357,203, 4,374,699, 4,460,436, 4,482,427 and 4,487,652.

In effecting plasma treatment in accordance with the practice of the present invention, the plasma gas is comprised of a volatile fluorohydrocarbon of no more than two carbon atoms and in which the carbon atoms are attached to a predominance of fluorine atoms. Exemplary of such fluorohydrocarbons are $CF_4$, $C_2F_6$, $CHF_3$, and $CH_2F_4$. The fluorohydrocarbon may be used alone or as a mixture with/or oxygen and an inert gas such as argon or nitrogen. When gaseous mixtures are used for generating the plasma the mixture generally contains, on a volume basis, from about 5 to about 100 percent of the fluorohydrocarbon, from about 0 to about 95% of the inert gas and from about 0 to about 90 percent oxygen. Preferably, the gaseous mixture contains about 60 to about 70 volume percent of the fluorohydrocarbon, and about 10 to about 20 volume percent oxygen and about 20 to about 30 percent of the inert gas as this combination has been found to yield the most reproducible results and to minimize etching of the substrate beneath the metal surface. Carbon tetrafluoride ($CF_4$) is the fluorohydrocarbon gas preferred for use in the plasma treatment step of the process of the present invention.

It is an optional practice of the present invention that after the metal layer has been subjected to the plasma environment containing the fluorohydrocarbon for about 10 to about 30 minutes, the exposure of the film layer to the fluorohydrocarbon containing plasma is interrupted and the fluorohydrocarbon containing gas in the reactor is replaced with a gaseous plasma consisting essentially of oxygen. The etching of the metal substrate is then continued for an additional 5 to 15 minutes. With this optional practice it is desirable that there be an interval of about 5 to about 20 minutes between the interruption of the fluorohydrocarbon flow to the reactor and the substitution of oxygen therefor. By this practice greater adhesion values are achieved under certain circumstances.

The plasma treatment step of the process of the present invention is conveniently conducted in a parallel plate reactor of the type conventionally used for plasma etching. In such reactor, there are one or more pairs of parallel plate electrodes with one electrode in each pair powered to between about 1000 and 5000 watts (RF) and the other electrode in each pair grounded. The total gas pressure utilized is typically about 100 to 500 m Torr and the total gas flow is typically about 1500 to 4000 sccm.

In practicing the plasma treatment step of the present invention, the metal coated dielectric substrate to be treated is placed either on the grounded electrode of the reactor or between an electrode pair so that the substrate is electrically isolated from the electrodes. A gas containing the fluorohydrocarbon compound with or without the inclusion of oxygen or inert gas is introduced into the reactor and a radio frequency (RF) power is applied between the powered and grounded electrodes to produce a plasma between them. The substrate material is exposed to this fluorohydrocarbon containing plasma for about 10 to about 30 minutes.

Thereafter, in an optional embodiment of the present invention, the power is turned off for about 5 to about 20 minutes and the gas atmosphere in the reactor is replaced with 100% by volume oxygen by interrupting the flow of the fluorohydrocarbon containing gas to the reactor and substituting oxygen therefor. Upon the replacement of the fluorohydrocarbon containing gas with oxygen in the reactor, the metal film layer is exposed to the oxygen plasma environment for an additional 5 to 15 minutes.

The metal surface treated in accordance with the present invention can then be laminated to a polymeric material such as a dielectric substrate material. Suitable dielectric substrate materials include both thermoplastic and thermosetting polymers, though preferably thermosetting polymers. Typical thermosetting polymeric materials to which the metal surface may be laminated include epoxy, phenolic based materials and polyimides. The dielectric materials may be molded articles of the polymers containing fillers and/or reinforcing agents such as glass-filled epoxy or phenolic based materials. Examples of some phenolic type materials include copolymers of phenol, resorcinol and cresol. Examples of some suitable thermoplastic polymeric materials include polyolefins, such as polypropylene, polysulfones, polycarbonates, nitrile rubbers and ABS polymers.

Bonding of a metal film coated polymeric substrate to a second polymeric material is conveniently carried out by pressing together opposed faces of a sheet of the second polymeric material and the sheet of the metal film coated polymeric substrate, the metal surface of which has been prepared according to the present invention with the treated metal surface of the metal coated polymeric substrate next to or confronting an opposed surface of the polymeric material, in a preheated laminating press at a predetermined pressure and temperature. The time of the pressing operation is variable depending upon the particular dielectric substrate material employed and the pressure employed. About 1 to 2 hours are adequate for the above conditions. The pressing can be done by loading a stack of panels on top of each other in the press. A practical amount is about 12 panels.

A laminate particularly suitable for use in the preparation of a multilayer printed circuit board using metal film surfaces treated in accordance with the process of this invention is prepared, for example, by placing a prepreg sheet comprised of a B-stage thermosetting epoxy resin impregnated glass fabric sheet in a laminating press on top of a copper film layer deposited on an epoxy impregnated glass fabric sheet, the copper layer having been previously treated with the metal oxide/plasma treatment of the present invention. The B-stage thermosetting epoxy resin of the prepreg sheet is further cured under the influence of heat and pressure.

The actual bonding of the B-stage prepreg to the treated copper film surface is accomplished by simultaneously pressing the laminating components together and baking at a temperature of about 250° F. to about 450° F., and preferably at about 300° F. to 400° F. at a pressure of about 5 to 1,000 psig for a period of time ranging from about 5 minutes to 120 minutes.

The metal film thickness may vary widely although, preferably, it will generally range from about 0.001 inch to about 0.003 inch in thickness. In a like manner, the thickness of the thermosetting or thermoplastic resin substrate utilized may vary from about 0.015 inch to 0.125 inch, or more, as by increasing the number of plies of prepreg in the laminating step.

The following examples further illustrate the invention, it being understood that the invention is in no way intended to be limited to the details described therein.

EXAMPLE I

An epoxy laminate having a thickness of about 0.01 inch having a 0.002 thick layer of electroless deposited copper was placed in a closed chamber on a conveyor belt at ambient temperature and blasted with a pressurized spray of an aluminum oxide slurry containing 20% by weight $Al_2O_3$ in deionized water pressurized to 55 psi. The aluminum oxide slurry was impinged on the copper film surface for an average period of 1.3 minutes.

The aluminum oxide treated copper film surface was then rinsed in deionized water to remove any residual $Al_2O_3$ on the foil surface and the surface dried by pressurized air. The 600×700 mm treated copper coated laminates were placed in a parallel electrode plasma reactor. Each sample to be plasma treated was placed between an RF powered electrode and a grounded electrode in the plasma reactor. The lower electrode was RF powered and the upper electrode was grounded. The input RF power was 3000 watts and the pressure during etching was 250 mTorr. The total gas flow averaged about 2000 sccm. Plasma treatment was initially carried out for 20 minutes using a variety of gas mixtures containing $CF_4$. After this period of time had elapsed the gas feed and RF power to the reactor were interrupted and the samples allowed to remain in the chamber for 10 minutes. Thereafter the gas feed and RF power to the reactor were resumed but the original $CF_4$ gas mixture was replaced with $O_2$ gas and etching continued for an additional 15 minutes. The dried samples were then laminated to an epoxy prepreg by a conventional multilayer (4 layers) procedure; i.e. 340 psi at 320° F. for 80 minutes.

The so-prepared laminates were subjected to the following standard peel test: Measure the peel value (in pounds) of a 1 inch wide strip when pulled at a 90° angle from the substrate at a rate of 1 inch/minute.

The peel values of the laminates in which the copper film surface was prepared in accordance with this Example I are summarized in Table I below.

For purposes of comparison, the procedure of Example I was repeated with the exception that either one or both of the sequential treatment steps of the process of the present invention were not used or alternatively pumice, a complex silicate of Al, K and Na was substituted for Al₂O₃ was merely brushed onto the copper film surface without using pressure. The peel values of these comparative laminates, designated by the symbol "C" are also summarized in Table I below:

TABLE I

| Run No. | Pretreatment | Initial Etch Gas Composition (Volume %) | | | Peel Value (lbs/in) |
|---|---|---|---|---|---|
| | | Ar | $O_2$ | $CF_4$ | |
| 1 | $Al_2O_3$ | 70 | 20 | 10 | 8.6 |
| $C_1$ | Pumice | 70 | 20 | 10 | 2.7 |
| $C_2$ | None | 70 | 20 | 10 | 1.5 |
| 2 | $Al_2O_3$ | 90 | — | 10 | 6.5 |
| $C_3$ | Pumice | 90 | — | 10 | 1.7 |
| $C_4$ | None | 90 | — | 10 | 1.2 |
| $C_5$ | $Al_2O_3$ | 100 | — | — | 3.1 |
| $C_6$ | None | 100 | — | — | 0.0* |
| $C_7$ | Pumice | 100 | — | — | 0.0* |

*too low to measure

By reference to the data in Table I, it is immediately apparent that the combination of sequential pressurized Al₂O₃/plasma etching steps in the treatment of electroless copper surfaces unexpectedly results in a dramatic increase in peel values when the plasma gas contains a fluorohydrocarbon. It is also apparent that the substitution of non-pressurized brushing of pumice for the pressurized spraying of alumina in the process of the present invention does not provide adhesion promotion to the copper in any way comparable to the pressurized alumina.

EXAMPLE II

The procedure of Example I was repeated with the exception that the Al₂O₃ treated foil was treated with fluorohydrocarbon containing plasma gas for 25 minutes and the plasma treatment step interrupted without substitution by 100% O₂.

The peel rates of the laminates in which the copper film surface was prepared in accordance with this Example 2 are summarized in Table II below.

For purposes of comparison, the procedure of Example 2 was repeated with the exception that there was no pressurized Al₂O₃ pretreatment or brushed, non-pressurized pumice was substituted for the pressurized Al₂O₃. The peel values of these comparative laminates, designated by the symbol "C" are also summarized in Table II below.

TABLE II

| Run No. | Pretreatment | Initial Etch Gas Composition (Volume %) | | | Peel Value (lbs/in) |
|---|---|---|---|---|---|
| | | Ar | $O_2$ | $CF_4$ | |
| 1 | $Al_2O_3$ | 70 | 20 | 10 | 5.7 |
| $C_1$ | Pumice | 70 | 20 | 10 | 4.3 |
| $C_2$ | None | 70 | 20 | 10 | 1.2 |
| 2 | $Al_2O_3$ | — | 60 | 40 | 7.0 |
| $C_3$ | Pumice | — | 60 | 40 | 1.8 |
| $C_4$ | None | — | 60 | 40 | 1.2 |
| 3 | $Al_2O_3$ | 30 | — | 70 | 8.7 |

By reference to Table II, it is apparent that the elimination of the O₂ treatment step results in slightly peel values for the laminates but this is overcome by using a higher concentration of CF₄ in the plasma step of the invention. The substitution of brushed pumice for pressurized Al₂O₃ in the process of the present invention again does not provide equivalent copper adhesion promotion.

EXAMPLE III

The procedure of Example I was repeated with the exception that the Al₂O₃ treated copper film was treated with fluorohydrocarbon containing plasma gas for 25 minutes and the plasma treatment step interrupted without substitution by 100% O₂.

The peel rates of the laminates in which the copper foil surface was prepared in accordance with this Example are summarized in Table III below.

For purposes of comparison, the procedure of Example III was repeated with the exception that the Al₂O₃ slurry stream was pressurized at 35 psi instead of 55 psi and the exposure time to the slurry was reduced to 0.6 minutes. The peel values of these comparative laminates, designated by the symbol "C" are also summarized in Table III below.

TABLE II

| Run No. | Pretreatment | Initial Etch Gas Composition (Volume %) | | | Peel Value (lb/in) |
|---|---|---|---|---|---|
| | | Ar | $C_2$ | $CF_4$ | |
| 1 | | 70 | 20 | 10 | 7.8 |
| $C_1$ | | 70 | 20 | 10 | 5.2 |
| 2 | | — | 60 | 40 | 7.2 |
| $C_2$ | | — | 60 | 40 | 3.5 |
| 3 | | — | 90 | 10 | 8.2 |
| 4 | | 90 | — | 10 | 5.8 |
| 5 | | — | 20 | 80 | 7.9 |

The data recorded in Table III indicate that pressure spraying the Al₂O₃ slurry on the copper film surface at relatively low pressures, e.g. 35 psi and short exposure times, e.g. 0.6 minutes does not impart the same improvement in adhesion promotion that is achieved at higher pressures, e.g. 55 psi and longer exposure times.

While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

What is claimed is:

1. A method for improving the adhesion of polymeric materials to metal surfaces which comprises sequentially (i) impinging on the surface of the metal a stream of a slurry pressurized to greater than 30 psi and in which is suspended metal oxide particles and then (ii) exposing the metal oxide treated metal surface in a gaseous plasma containing a fluorohydrocarbon compound.

2. The method of claim 1 wherein the metal oxide particles are aluminum oxide particles.

3. The method of claim 1 wherein the metal surface is copper.

4. The method of claim 1 wherein the polymeric substrate is formed from a thermosetting resin.

5. The method of claim 4 wherein the thermosetting resin is an epoxy resin.

6. The method of claim 1 wherein the slurry is comprised of aluminum oxide particles suspended in water at a concentration of about 15 to about 25 percent by weight.

7. The method of claim 1 wherein the slurry stream is pressurized to between about 40 and about 80 psi.

8. The method of claim 1 wherein the fluorohydrocarbon is $CF_4$.

9. The method of claim 1 wherein the gaseous plasma is formed from a mixture of a fluorohydrocarbon and one or more gases selected from the group consisting of oxygen, nitrogen and argon.

10. The method of claim 9 wherein the gaseous plasma is formed from a mixture of about 60 to 70 volume percent fluorohydrocarbon, about 10 to 20 volume percent oxygen, and about 20 to 30 volume percent argon.

11. The method of claim 1 wherein the gaseous plasma treatment is followed by a second gaseous plasma treatment utilizing 100 percent oxygen.

12. The method of claim 11 wherein there is an interval of about 5 to about 20 minutes between the two plasma treatments.

* * * * *

UNITED STATES PATENT AND TRADEMARK OFFICE
CERTIFICATE OF CORRECTION

PATENT NO. : 4,689,111
DATED     : August 25, 1987
INVENTOR(S) : Kevin K. Chan et al.

It is certified that error appears in the above-identified patent and that said Letters Patent is hereby corrected as shown below:

Column 8, lines 18-29, the Table should read:

TABLE III

| Run No. | Preatreatment | Initial Etch Gas Composition (Volume %) | | | Peel Value (lb/in) |
|---|---|---|---|---|---|
| | | Ar | $O_2$ | $CF_4$ | |
| 1 | $Al_2O_3$ | 70 | 20 | 10 | 7.8 |
| $C_1$ | Pumice | 70 | 20 | 10 | 5.2 |
| 2 | None | -- | 60 | 40 | 7.2 |
| $C_2$ | $Al_2O_3$ | -- | 60 | 40 | 3.5 |
| 3 | Pumice | -- | 90 | 10 | 8.2 |
| 4 | None | 90 | -- | 10 | 5.8 |
| 5 | $Al_2O_3$ | -- | 20 | 80 | 7.9 |

Signed and Sealed this

Fifth Day of July, 1988

Attest:

DONALD J. QUIGG

Attesting Officer

Commissioner of Patents and Trademarks